(12) United States Patent
Kim et al.

(10) Patent No.: US 9,048,343 B2
(45) Date of Patent: Jun. 2, 2015

(54) SEMICONDUCTOR LIGHT EMITTING DEVICE AND METHOD OF MANUFACTURING THE SAME

(71) Applicant: SAMSUNG ELECTRONICS CO., LTD., Gyeonggi-do (KR)

(72) Inventors: Tae Hyung Kim, Gyeonggi-do (KR); Gi Bum Kim, Gyeonggi-do (KR); Yu Seung Kim, Seoul (KR); Seung Woo Choi, Gyeonggi-do (KR); Gyeong Seon Park, Seoul (KR); Shi Young Lee, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 65 days.

(21) Appl. No.: 13/762,983

(22) Filed: Feb. 8, 2013

(65) Prior Publication Data

US 2013/0203195 A1    Aug. 8, 2013

(30) Foreign Application Priority Data

Feb. 8, 2012   (KR) ..................... 10-2012-0012834

(51) Int. Cl.
*H01L 21/00*   (2006.01)
*H01L 33/00*   (2010.01)

(52) U.S. Cl.
CPC .......... *H01L 33/005* (2013.01); *H01L 33/0079* (2013.01)

(58) Field of Classification Search
CPC ............ H01L 2924/00; H01L 33/0079; H01L 33/007; H01L 2924/12041; H01L 33/44; H01L 33/08; H01L 21/187; H01L 24/97; H01L 33/24; H01L 2224/0603; H01L 2224/49113; H01L 24/06
See application file for complete search history.

(56) References Cited

U.S. PATENT DOCUMENTS

| | | | |
|---|---|---|---|
| 7,781,242 B1 * | 8/2010 | Chen et al. ...................... | 438/29 |
| 8,497,146 B2 * | 7/2013 | Odnoblyudov et al. ......... | 438/33 |
| 8,623,685 B2 * | 1/2014 | Cheng ............................. | 438/46 |
| 2008/0081400 A1 * | 4/2008 | Doi et al. ....................... | 438/118 |
| 2010/0210089 A1 * | 8/2010 | Kasai et al. .................... | 438/458 |
| 2011/0018104 A1 * | 1/2011 | Nagashima et al. ........... | 257/615 |
| 2011/0039368 A1 * | 2/2011 | Boussagol et al. ............. | 438/93 |
| 2011/0089436 A1 * | 4/2011 | Jeong et al. ..................... | 257/79 |
| 2011/0133216 A1 * | 6/2011 | Sugawara ........................ | 257/88 |
| 2011/0260192 A1 * | 10/2011 | Kwak et al. ..................... | 257/98 |
| 2012/0292649 A1 * | 11/2012 | Sugiyama et al. .............. | 257/94 |

(Continued)

FOREIGN PATENT DOCUMENTS

| | | |
|---|---|---|
| JP | 2003-068593 A | 3/2003 |
| KR | 20060057766 A | 5/2006 |

(Continued)

*Primary Examiner* — Bac Au

(74) *Attorney, Agent, or Firm* — McDermott Will & Emery LLP

(57) ABSTRACT

A method of manufacturing a semiconductor light emitting device, includes forming a light emitting structure on a growth substrate. The light emitting structure includes a first conductive semiconductor layer, an active layer and a second conductive semiconductor layer. A support substrate having one or more protrusions formed on one surface thereof is prepared. The one or more protrusions formed on the one surface of the support substrate are attached to one surface of the light emitting structure. The growth substrate is separated from the light emitting structure.

18 Claims, 7 Drawing Sheets

(56) References Cited

U.S. PATENT DOCUMENTS

2012/0319161 A1* 12/2012 Gotoda et al. ................. 257/103
2013/0214300 A1* 8/2013 Lerman et al. .................. 257/88

FOREIGN PATENT DOCUMENTS

| KR | 20060061305 A | 6/2006 |
| KR | 2010006291 A | 1/2010 |

* cited by examiner

SEMICONDUCTOR LIGHT EMITTING DEVICE AND METHOD OF MANUFACTURING THE SAME

CROSS-REFERENCE TO RELATED APPLICATION

This U.S. non-provisional application claims benefit of priority of Korean Patent Application No. 10-2012-0012834 filed on Feb. 8, 2012, in the Korean Intellectual Property Office, the entire contents of which are hereby incorporated by reference.

TECHNICAL FIELD

The present inventive concept relates to a semiconductor light emitting device and a method of manufacturing the same.

BACKGROUND

A light emitting diode (LED), a semiconductor light emitting device, is a photoelectric device capable of generating various colors of light through the recombination of electrons and holes at a p-n junction by using p-n junction structure characteristics. That is, when a forward directional voltage is applied to a specific element of a semiconductor, electrons and holes are recombined while the electrons and holes move through a junction between an anode and a cathode. Since an amount of energy in the recombined electrons and holes is smaller than an amount of energy in electrons and holes separated from one another, light is emitted to the outside of the LED due to the energy difference.

The device as described above may be provided in a state in which a growth substrate used for the growth of a semiconductor layer has been removed in order to secure a wide light emitting region and allow current applied thereto to flow uniformly throughout the overall region of the device, or the like. In order to remove a growth substrate, a method in which a support substrate is attached to a light emitting structure and a laser beam or the like is then irradiated thereonto is used. In this process, a large amount of stress acts on the light emitting structure, caused due to differences in thermal expansion coefficients between the growth substrate, a semiconductor layer and the support substrate. As such, a defect, e.g., cracks, may occur due to the stress acting on the semiconductor layer in the process of removing the growth substrate. Thus, light emission efficiency in the device may be degraded. In particular, this defect may further increase as the size of a wafer increases. Accordingly, research on a scheme for significantly reducing an influence of a difference in thermal expansion coefficients when a growth substrate is eliminated in the art has been under way.

SUMMARY

An aspect of the present inventive concept relates to a method of manufacturing a semiconductor light emitting device, capable of significantly reducing stress influencing a semiconductor layer by omitting a growth substrate, thereby reducing an occurrence of cracks.

An aspect of the present inventive concept encompasses a method of manufacturing a semiconductor light emitting device. The method includes forming a light emitting structure on a growth substrate such that the light emitting structure includes a first conductive semiconductor layer, an active layer and a second conductive semiconductor layer. A support substrate having one or more protrusions formed on one surface thereof is prepared. The one or more protrusions formed on the one surface of the support substrate are attached to one surface of the light emitting structure. The growth substrate is separated from the light emitting structure.

A portion of the support substrate may be separated from the light emitting structure during or after the attaching of the one or more protrusions to the one surface of the light emitting structure.

After the separating of the portion of the support substrate from the light emitting structure, only at least portions in the protrusions of the support substrate may remain and be combined with the light emitting structure.

The method may further include forming a temporary substrate to be attached to the support substrate after the separating of the portion of the support substrate from the light emitting structure.

The protrusions may be a plurality of protrusions, and only at least portions in the protrusions may remain and be combined with the light emitting structure by allowing the portion of the support substrate to be separated from the at least portion in the protrusions, thereby separating the plurality of protrusions from one another.

The portion of the support substrate may be separated from the light emitting structure through a polishing process.

The portion of the support substrate may be spontaneously separated from the light emitting structure in the attaching of the one or more protrusions of the support substrate to the one surface of the light emitting structure.

The preparing of the support substrate may include implanting ions into the support substrate.

A process temperature in the attaching of the support substrate to the one surface of the light emitting structure may be increased, and the support substrate may be separated from the light emitting structure during the increasing of the process temperature.

The preparing of the support substrate may include implanting the ions into a first support substrate, attaching the first support substrate having the ions implanted thereinto to a second support substrate, and forming the protrusions by removing portions of the first and second support substrates.

The protrusions may be formed to have a depth at which a portion of a region of the first support substrate having the implanted ions is removable.

The preparing of the support substrate may include preparing first and second support substrates and attaching the first and second support substrates to each other, and forming the protrusions by removing the portions of the first and second support substrates.

A temperature during the attaching of the one or more protrusions of the support substrate to the one surface of the light emitting structure may be lowered, and the portion of the support substrate may be separated from the light emitting structure during an operation of the temperature lowering.

The protrusions may be formed to have a depth at which a portion of a contact surface between the first and second support substrates is removable.

The protrusion may be a plurality of protrusions.

The forming of the light emitting structure may include dividing the light emitting structure into a plurality of light emitting structures.

The plurality of protrusions may be attached to corresponding ones of the plurality of light emitting structures.

The portion of the support substrate may be separated from the light emitting structure during the attaching the one or more protrusions of the support substrate to the one surface of the light emitting structure or thereafter.

Only at least portions of the protrusions may be combined with the light emitting structure to remain by the separating of the portion of the support substrate from the light emitting structure, and the plurality of protrusions may be separated from one another by the plurality of light emitting structure devices.

The light emitting structure may be formed on the growth substrate such that the light emitting structure further includes a reflective layer formed on the second conductive semiconductor layer.

BRIEF DESCRIPTION OF THE DRAWINGS

The foregoing and other features of the inventive concept will be apparent from more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

DETAILED DESCRIPTION OF THE EMBODIMENTS

Figure 1:
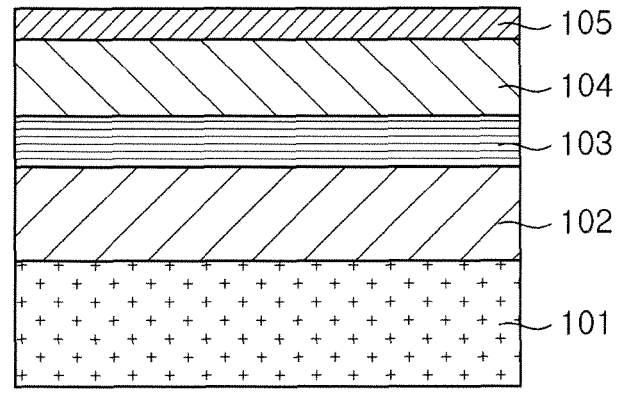
FIGS. 1 to 14 are cross-sectional views schematically illustrating respective processes in a method of manufacturing a semiconductor light emitting device according to embodiments of the present inventive concept.

Examples of the present inventive concept will be described below in more detail with reference to the accompanying drawings. The examples of the present inventive concept may, however, be embodied in different forms and should not be construed as limited to the examples set forth herein. Like reference numerals may refer to like elements throughout the specification.

Hereinafter, referring to the drawings, the examples of the present inventive concept will be described in further detail.

FIGS. 1 to 14 are cross-sectional views schematically illustrating respective processes in a method of manufacturing a semiconductor light emitting device according to embodiments of the present inventive concept.

First, as shown in FIG. 1, a growth structure 101 may include a light emitting structure, that is, a first conductive semiconductor layer 102, an active layer 103 and a second conductive semiconductor layer 104, formed thereon. In this case, the light emitting structure may include a reflective layer 105 formed on an upper part of the second conductive semiconductor layer 104. The terminology used herein, such as 'upper part', 'upper surface', 'lower part', 'lower surface', 'lateral surface', and the like, is provided based on the drawings. Thus, a position therefor may actually be varied according to a direction in which a device is disposed.

The growth substrate 101 may be provided as a base part for the growth of a semiconductor and may be formed of an insulating and conductive semiconductor material such as sapphire, Si, SiC, $MgAl_2O_4$, MgO, $LiAlO_2$, $LiGaO_2$, GaN, or the like. Sapphire, which has electrical insulation may be used for the growth substrate 101. Sapphire may be a crystal having Hexa-Rhombo R3c symmetry, and may have respective lattice constants of 13.001 Å and 4.758 Å in c-axis and a-axis directions. Sapphire may have a C (0001) plane, an A (1120) plane, an R (1102) plane and the like. In one embodiment of the present inventive concept, since the C plane comparatively facilitates the growth of a nitride thin film and is stable at a relatively high temperature, the C plane may be mainly used as a growth substrate for a nitride semiconductor.

Meanwhile, when sapphire having a thermal expansion coefficient of about 7.9 ppm is used for the growth substrate 101, since sapphire has a relatively large difference, in terms of a thermal expansion coefficient to a general material used for a support substrate to be described below, for example, Silicon (Si: thermal expansion coefficient about 2.6 ppm) or the like, the light emitting structure may be affected by a relatively large amount of stress due to a large difference therebetween during a process of removing the growth substrate 101 or subsequent processes. Therefore, in an embodiment of the present inventive concept, the stress occurring thereby may be significantly reduced by varying a structure of the support substrate.

The first and second conductive semiconductor layers 102 and 104 may be formed of semiconductor layers respectively doped with n-type and p-type impurities, but are not limited thereto. Alternatively, the first and second conductive semiconductor layers 102 and 104 may be formed of semiconductor layers respectively doped with p-type and n-type impurities. The first and second conductive semiconductor layers 102 and 104 may be formed of a nitride semiconductor, for example, a material having a compositional formula of $Al_xIn_yGa_{1-x-y}N$ ($0 \leq x \leq 1$, $0 \leq y \leq 1$, and $0 \leq x+y \leq 1$). Each of the first and second conductive semiconductor layers 102 and 104 may include a single layer or a plurality of layers having different properties such as doping concentrations, compositions, and the like. In addition, the first and second conductive semiconductor layers 102 and 104 may be formed of an AlInGaP-based or AlInGaAs-based semiconductor, other than a nitride semiconductor.

The active layer 103 disposed between the first and second conductive semiconductor layers 102 and 104 may emit light having a predetermined amount of energy due to electron-hole recombination. Further, the active layer 103 may have a multiple quantum well (MQW) structure in which quantum well layers and quantum barrier layers are alternately stacked on top of each other. For example, in the case of a nitride semiconductor, the active layer 103 may have a region in which the quantum well layers may be formed of InGaN (the contents of In and Ga may be changed), and the quantum barrier layers may be formed of GaN, InGaN (the contents of In and Ga may be changed and the content of In may be lower than in the quantum well layers), AlInGaN (the contents of Al, In, and Ga may be changed), or the like.

Meanwhile, the first and second conductive semiconductor layers 102 and 104 and the active layer 103, which constitute a light emitting structure, may be grown by using a method known in the art, for example, metal organic chemical vapor deposition (MOCVD), hydride vapor phase epitaxy (HVPE), molecular beam epitaxy (MBE), or the like. Although not illustrated, a buffer layer for relieving stress applied to the first conductive semiconductor layer 102 to increase the crystallinity of the first conductive semiconductor layer 102 may be formed on the substrate 101 before the first conductive semiconductor layer 102 is formed. In addition, an electron blocking layer having a relatively high energy bandgap may be interposed between the active layer 103 and the second conductive semiconductor layer 104 and may serve to prevent electrons from overflowing into the second conductive semiconductor layer 104 after passing through the active layer 103.

The reflective layer 105 may be formed of a material having electrical ohmic characteristics with respect to the second conductive semiconductor layer 104, and may also have a function of reflecting light emitted from the active layer 103. In realizing this function, the reflective layer 105 may be formed to include a metal such as silver (Ag), nickel (Ni), aluminium (Al), rhodium (Rh), palladium (Pd), iridium (Ir), ruthenium (Ru), magnesium (Mg), zinc (Zn), platinum (Pt), gold (Au), or the like, and may be formed through a deposition process, a sputtering process, or the like. However, the reflective layer 105 may not necessarily be formed of a metal, and may be formed of a different conductive material able to perform a reflective function. Further, a structure such as DBR (Distributed Bragg Reflector) or the like may be employed in order to relatively improve a reflective function of the reflective layer 105. In this case, when DBR includes an electrically insulating material such as a titanium oxide (TiO$_2$), SiO$_2$, or the like, the reflective layer 105 may include both of a region formed of a conductive material and a reflective structure such as DBR or the like. The reflective layer 105 may be omitted according to an embodiment of the present inventive concept.

Figure 2:
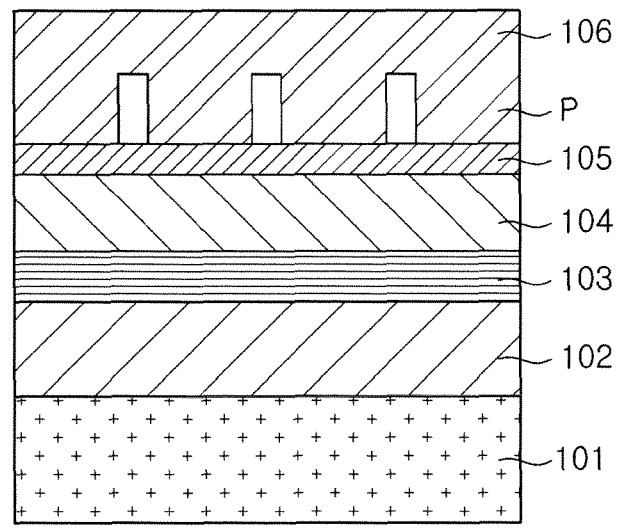

Subsequently, as shown in FIG. 2, a support substrate 106 is attached to the light emitting structure. The support substrate 106 may serve to support the light emitting structure in a process of removing the growth substrate 101. In addition, the support substrate 106 may be formed of a conductive material or provided in a scheme in which a conductive via is included therein or the like, to thereby serve to transfer an electrical signal to the first conductive semiconductor layer 102 or the second conductive semiconductor layer 104. In realizing this function, the support substrate 106 may be formed of a material containing at least one of materials such as Au, Ni, Al, Cu, W, Si, Se, GaAs, and the like. Among these materials, Si is generally easy to obtain in terms of supply and demand thereof and thus, may be provided at relatively low cost, and thus can be effectively used for a support substrate having, in particular, a relatively large area (for example, 6 inches or more in diameter). In this case, in order to improve electrical characteristics, an Si semiconductor or the like may be doped with an appropriate amount of doping elements. However, Si has a thermal expansion coefficient of about 2.6 ppm, which is different from a thermal expansion coefficient of the growth substrate 101 formed of sapphire or the like, or a material of a nitride semiconductor. Therefore, as described above, a crack may occur in the light emitting structure during a process in which the growth substrate is separated, a subsequent cooling process, or the like.

In order to reduce the occurrence of cracks, according to an embodiment of the present inventive concept, one or more protrusions P (see FIG. 2) may be formed on one surface of the support substrate 106 so as to reduce an area thereof contacting the light emitting structure. For example, as shown in FIG. 2, four protrusions P protrude from the support substrate 106 toward the reflective layer 105. Accordingly, the occurrence of stress due to a difference in terms of the thermal expansion coefficients between the light emitting structure and the growth substrate 101, may be reduced. In this case, although not shown in the drawings, in order to bond the support substrate 106 to the light emitting structure, a eutectic metal or a bonding material such as a polymer or the like may be interposed therebetween, and a coupling process thereof may be performed through a method of increasing a temperature of a bonding material or the like. In addition, a region corresponding to a space between the protrusions P may be filled with a protective material such as a polymer or the like in order to protect the light emitting structure. On the other hand, as described below, a region of a portion of the support substrate 106 may be separated or eliminated during the process of the attachment thereof to the light emitting structure or after the attachment thereof, such that only regions corresponding to the protrusions P may be attached to the light emitting structure to remain and thus a stress relieving effect may thereby be improved.

Figure 3:
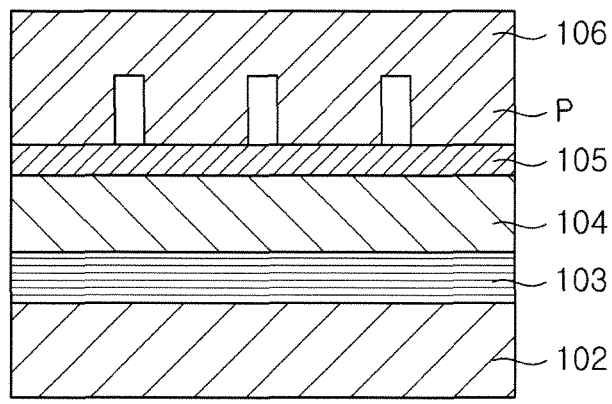

Next, after the support substrate 106 is attached to the light emitting structure, as shown in FIG. 3, the growth substrate 101 may be separated therefrom. The growth substrate 106 may be separated using a process such as a laser lift-off, a chemical lift-off, or the like. In this case, as described above, stress applied to the light emitting structure may be reduced by the protrusions P formed on the support substrate 106 during the process of removing the growth substrate 101 or during a subsequent process. After the growth substrate 101 is separated from the light emitting structure, although not shown in the drawings, an electrode may be formed on the first conductive semiconductor layer 102 from which the growth substrate has been removed to thus expose the first conductive semiconductor layer 102. In this case, as a process that may be added thereto, a dicing process in which the light emitting structure and the support substrate 106 are divided into devices may also be performed. The support substrate 106 may also be retained in a finally provided device to serve as an electrode, a support, or the like. Alternatively, the support substrate 106 may be removed from the finally provided device.

Figure 4:
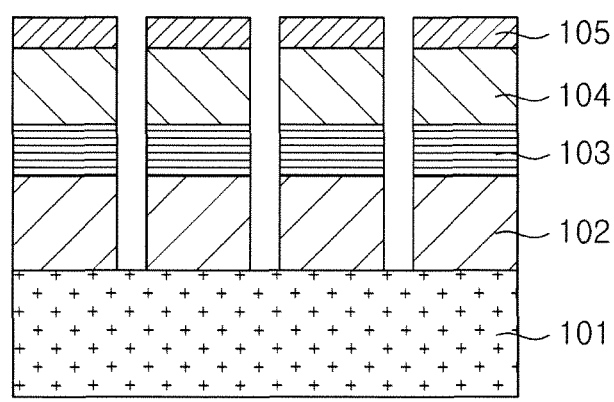

Meanwhile, in another embodiment of the present inventive concept, the light emitting structure may also be divided into devices before attaching the support substrate 106 to the light emitting structure, and this will be described with reference to FIGS. 4 to 7. As shown in FIG. 4, the light emitting structure may be divided into a plurality of devices. The dividing may be performed by using an appropriate dry etching process, a wet etching process, or the like. The dividing may be performed after all processes up to the formation of the reflective layer 105 are performed. That is, the light emitting structure may be divided into devices by forming up to the second conductive semiconductor layer 104, and then, the reflective layer 105 may be formed on respectively divided regions.

Figure 5:
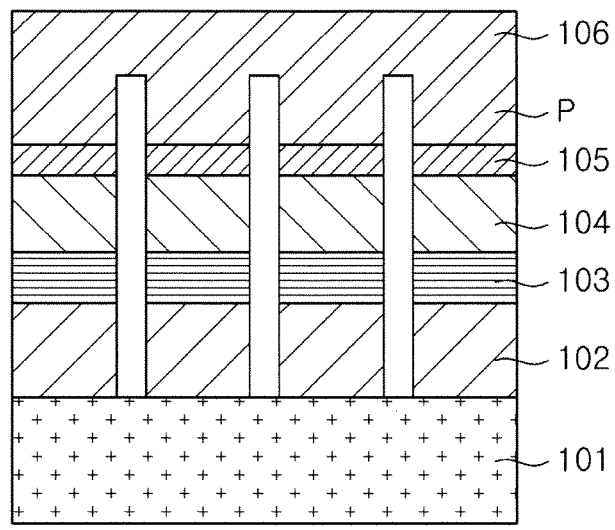
Figure 6:
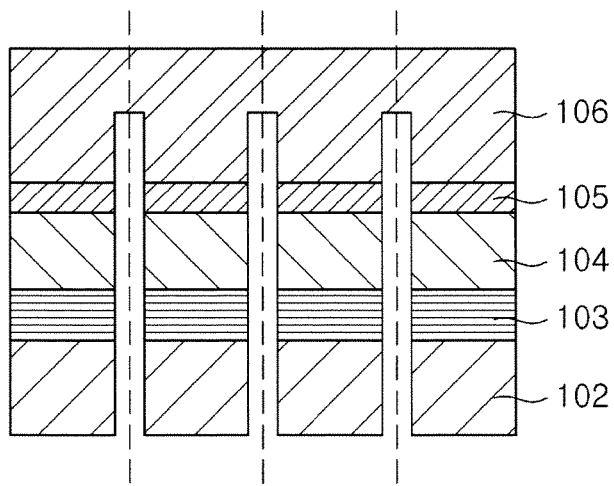

Thereafter, as shown in FIG. 5, the support substrate 106 may be attached to the light emitting structure, such that the plurality of protrusions P may be attached to the light emitting structure and correspond to a plurality of divided light emitting structures. However, one protrusion P is not limited to only corresponding to a divided single light emitting structure. For example, one protrusion P may be attached corresponding to two or more divided light emitting structures. Then, as shown in FIG. 6, the growth substrate 101 may be separated from the light emitting structure in the scheme described above, and then, the support substrate 106 may be diced in devices to thereby obtain individual devices. Here, as a method of dicing the support substrate 106, a dry etching method, a wet etching method, a laser etching method, or the like may be used.

Figure 7:
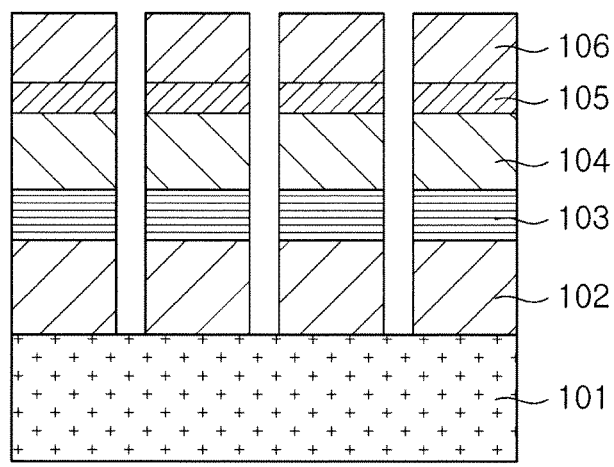

Meanwhile, in another embodiment of the present inventive concept, a portion of the support substrate 106 may be separated from the light emitting structure during the process of attaching the support substrate 106 to one surface of the light emitting structure or thereafter. Subsequently, in a state in which a portion of the support substrate 106 is separated from the light emitting structure, the growth substrate 101 separating process may be performed. This will be described with reference to FIGS. 7 to 14. As illustrated in FIG. 7, in the support substrate 106, only portions in a region corresponding to the protrusions may remain and portions of the support substrate 106 except for the remaining portions may be removed or separated from the light emitting structure. As such, as the support substrate 106 is divided into relatively small sized regions, the occurrence of cracks due to differences in thermal expansion coefficient between the support substrate 106 and the growth substrate 101 or the like may be relatively reduced. In this case, although FIG. 7 illustrates a case in which the light emitting structure is divided into device units, this may also be applied to a case with reference to FIGS. 1 to 3 in which the light emitting structure is not divided into device units.

In the method in which the support substrate 106 is divided into relatively small sized device units, there may be provided a method of polishing the support substrate 106. That is, a portion of the support substrate 106, specifically, regions except for the protrusions P may be removed through a polishing process such that only a plurality of protrusions P remain. The plurality of remaining protrusions P may be separated from one another, and in a similar manner thereto, may be attached to the light emitting structures divided into device units. However, the support substrate 106 may also be spontaneously separated even without passing through a forced polishing process, and to this end, a region having relatively low coupling force may be formed on a portion of the support substrate 106. As such, in the case of a scheme in which the support substrate 106 is spontaneously separated, process convenience and device reliability may be provided. A description thereof will hereinafter be provided in detail.

Figure 8:
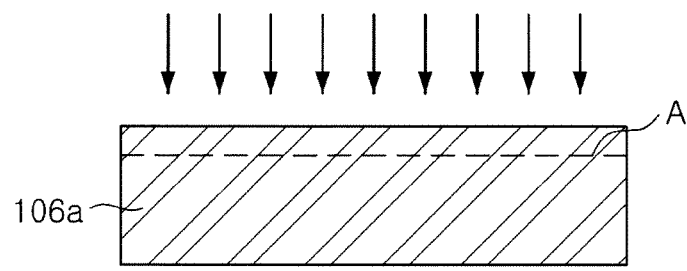
Figure 9:
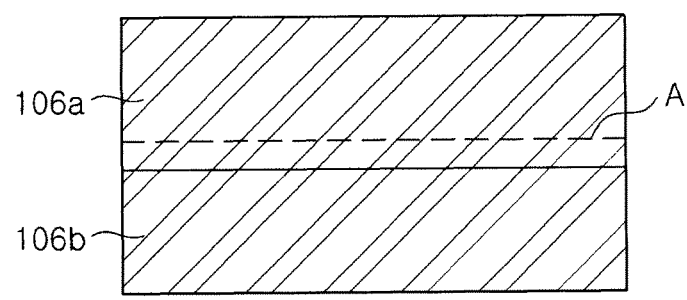
Figure 10:
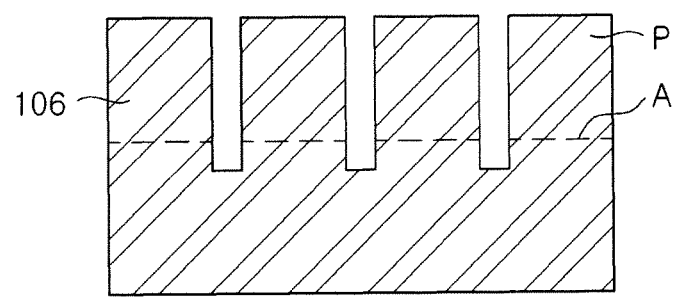
Figure 11:
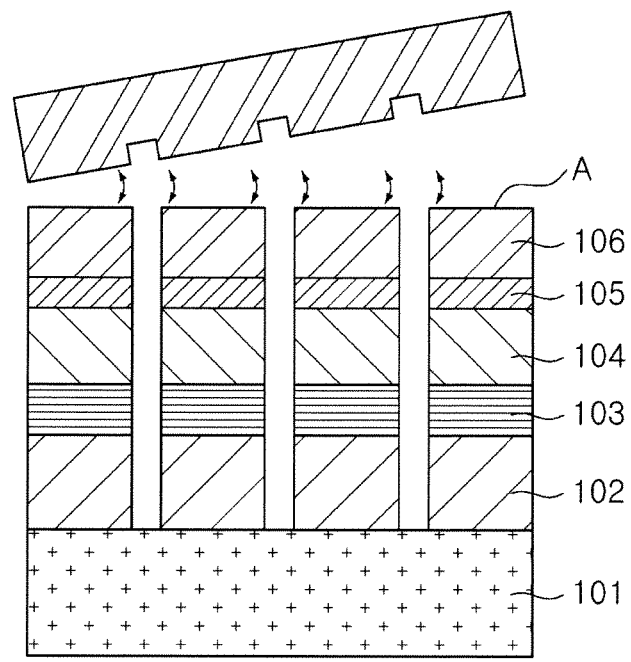

With reference to FIGS. 8 to 11, an example of a method of manufacturing the support substrate 106 will be described. First, as shown in FIG. 8, a first support substrate 106a may be prepared and ions may be implanted therein, and thus, an ion implantation region A in which a crystal thereof is damaged may be formed. As an example of implanted ions, hydrogen ions or the like may be used, and ions may be implanted into an inner part of the first support substrate 106a such that the first support substrate 106a may be separated (for example, in a smart cut process), based on the ion implantation region A, at the time of an increase in temperature. In this case, in order to allow for spontaneous occurrence of debonding in the ion implantation region A during the coupling process of the support substrate 106, a temperature at which the debonding occurs in the ion implantation region A may be lower than a temperature for the coupling of the support substrate 106 and the light emitting structure. For example, in a case in which a eutectic metal such as AuSn is used as a bonding material, debonding may occur in the ion implantation region A at a temperature of about 200 to 250° C., and accordingly, as shown in FIG. 11, a portion of the support substrate 106 may be separated during the process of increasing a temperature in a process of attaching the support substrate 106 to one surface of the light emitting structure.

A subsequent process of manufacturing the support substrate 106 is described. After the ion implantation process, as shown in FIG. 9, the first support substrate 106a having ions implanted thereinto may be attached to a second support substrate 106b. The second support substrate 106b may be formed of the same material as the material of the first support substrate 106a, for example, silicon (Si). Then, as shown in FIG. 10, portions of the first and second support substrates 106a and 106b may be removed by using a method of dry etching, wet etching, laser etching or the like, to thus form protrusions P on the support substrate 106. In this case, the protrusions P may be formed to have a depth at which a portion of the ion implantation region A can be removed. As such, the protrusions P are formed to have a depth deeper than the depth of the ion implantation region A of the first support substrate 106a. Therefore, only the protrusions P remain in the separation process of the support substrate 106 and may be separated by divided light emitting structure units.

Subsequently, the support substrate 106 manufactured through the scheme described above may be attached to the light emitting structure. As shown in FIG. 11, a portion of the support substrate 106 may be spontaneously separated from the light emitting structure, along a boundary of the ion implantation region A, during a process of increasing a temperature for attaching. As described above, in the ion implantation region A, debonding may occur at a temperature, for example, at a temperature of about 200 to 250° C., which is lower than a temperature in which the attaching between the support substrate 106 and the light emitting structure is completed. Then, the support substrate 106 and the light emitting structure may be bonded by continuously increasing the temperature. In a similar manner to the embodiment of the present inventive concept, the support substrate 106 may be spontaneously divided into device units, whereby stress applied to the light emitting structure in a subsequent process may be reduced. In addition, since a dicing process using a laser or the like may be omitted, process convenience and device reliability may be improved.

Figure 12:
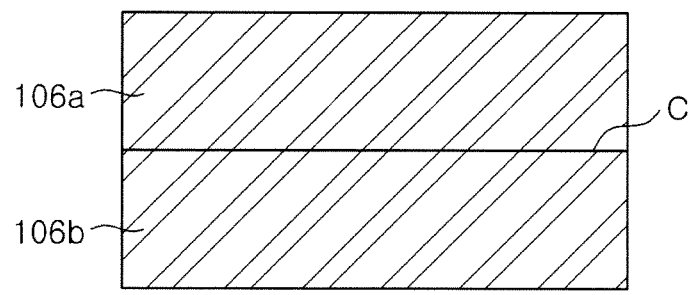

Meanwhile, an example of another method of inducing a spontaneous separation of the support substrate 106, besides ion implantation, is described. First, as shown in FIG. 12, first and second support substrates 106a and 106b may be prepared and attached to each other. In this case, the first and second support substrates 106a and 106b may be directly attached so as to have a contact surface C therebetween without other bonding material being interposed therein, and to this end, heat, pressure, or the like may be applied thereto as necessary.

Figure 13:
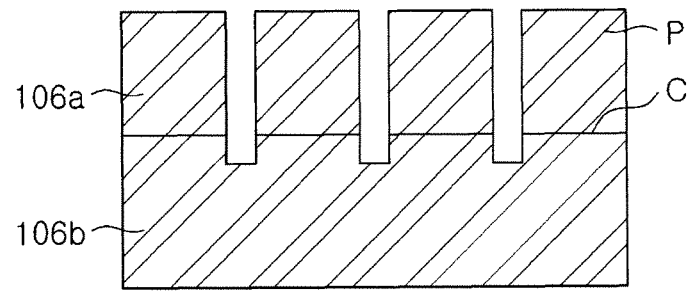

Next, as shown in FIG. 13, protrusions P may be formed by removing portions of the first and second support substrates 106a and 106b. Here, in a similar manner to the embodiments described above, the protrusions P may be formed to have a depth at which a portion of the contact surface C between the first and second support substrates 106a and 106b can be removed. As such, the protrusions P are formed to have a deeper depth as compared to the plane level of the contact surface C such that only the protrusions P remain in the decoupling process of the support substrate 106, thereby being divided into individual devices, and providing divided light emitting structures. Since stress generated due to a difference in thermal expansion coefficients between the light emitting structure and the support substrate 106 is generally greater than a coupling force on the contact surface C, spontaneous separation in the support substrate may be generated in the coupling process of the support substrate 106. In this case, unlike the spontaneous separation through the previously described ion implantation, a portion of the support substrate 106 may be separated from the light emitting structure during a process of decreasing a temperature after the attachment of the support substrate 106 in the process of the attachment thereof to one surface of the light emitting structure.

Figure 14:
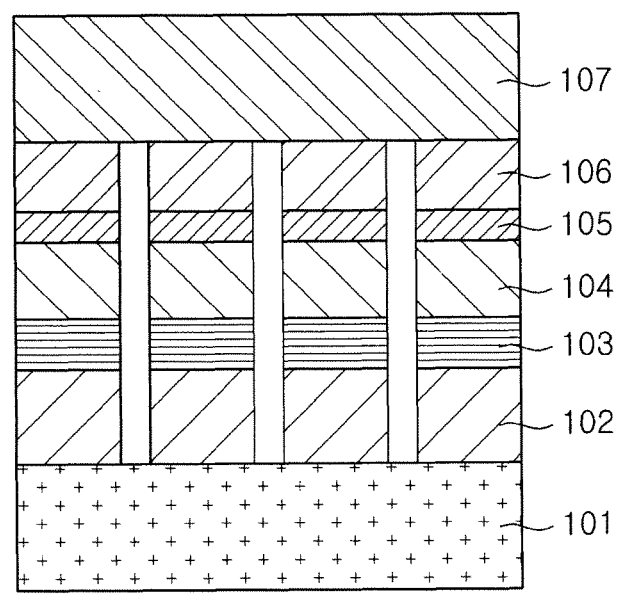

Meanwhile, when the support substrate 106 is divided into device units (as shown in FIG. 7), a temporary substrate may be used in order to remove the growth substrate 101. That is, as shown in FIG. 14, a temporary substrate 107 may be formed to be attached to the support substrate 106 divided into the device units and the growth substrate 101 may be eliminated by using the temporary substrate 107 as a support. In this case, the temporary substrate 107 may be formed of any material capable of supporting the light emitting structure, for example, a polymer, glass, a semiconductor, or the like, and specifically, a material having a thermal expansion coefficient similar to a material forming a semiconductor layer configuring the growth substrate 101 or the light emitting structure may be appropriately selected. After removing the growth substrate 101, in a similar manner to the embodiments described above, an electrode is formed such that the electrode may be connected to the second conductive semiconductor layer 102. Further, although not shown in the drawings, the temporary substrate 107 may be eliminated through a process of polishing the temporary substrate 107 as necessary. Alternatively, the temporary substrate 107 may not be eliminated, but remain in the device.

As set forth above, a method of manufacturing a light emitting device according to an embodiment of the present inventive concept, a stress applied to a semiconductor layer at the time of elimination of a growth substrate may be significantly reduced, thereby reducing occurrence of crack.

While the present inventive concept has been shown and described in connection with the embodiments, it will be apparent to those skilled in the art that modifications and variations can be made without departing from the spirit and scope of the inventive concept as defined by the appended claims.

What is claimed is:

1. A method of manufacturing a semiconductor light emitting device, the method comprising steps of:
    forming a light emitting structure on a growth substrate, such that the light emitting structure includes a first conductive semiconductor layer, an active layer and a second conductive semiconductor layer;
    preparing a support substrate having one or more protrusions formed on one surface thereof;
    attaching the one or more protrusions formed on the one surface of the support substrate to one surface of the light emitting structure;
    separating the growth substrate from the light emitting structure;
    separating a portion of the support substrate from the light emitting structure during or after the step of attaching the one or more protrusions to the one surface of the light emitting structure; and
    forming a temporary substrate to be attached to the support substrate after the separating of the portion of the support substrate from the light emitting structure,
    wherein a space between the one or more protrusions is formed inside the support substrate.

2. The method of claim 1, wherein after the separating of the portion of the support substrate from the light emitting structure, only at least portions in the protrusions of the support substrate remain and are combined with the light emitting structure.

3. The method of claim 1, wherein:
    the protrusions are a plurality of protrusions, and
    only at least portions in the protrusions remain and are combined with the light emitting structure by allowing the portion of the support substrate to be separated from the at least portion in the protrusions, thereby separating the plurality of protrusions from one another.

4. The method of claim 1, wherein the portion of the support substrate is separated from the light emitting structure through a polishing process.

5. The method of claim 1, wherein the portion of the support substrate is spontaneously separated from the light emitting structure in the step of attaching the one or more protrusions of the support substrate to the one surface of the light emitting structure.

6. The method of claim 5, wherein the step of preparing the support substrate includes the step of:
    implanting ions into the support substrate.

7. The method of claim 6, further comprising the step of:
    increasing a process temperature in the step of attaching the support substrate to the one surface of the light emitting structure, such that the portion of the support substrate is separated from the light emitting structure during the temperature increasing step.

8. The method of claim 5, wherein the step of preparing the support substrate further includes the steps of:
    implanting the ions into a first support substrate,
    attaching the first support substrate having the ions implanted thereinto to a second support substrate, and
    forming the protrusions by removing portions of the first and second support substrates.

9. The method of claim 8, wherein the protrusions are formed to have a depth at which a portion of a region of the first support substrate having the implanted ions is removable.

10. The method of claim 5, wherein the step of preparing the support substrate further includes the steps of:
    preparing first and second support substrates and attaching the first and second support substrates to each other, and
    forming the protrusions by removing the portions of the first and second support substrates.

11. The method of claim 10, further comprising the step of:
    lowering a temperature during the step of attaching the one or more protrusions of the support substrate to the one surface of the light emitting structure such that the portion of the support substrate is separated from the light emitting structure during the temperature lowering step.

12. The method of claim 10, wherein the protrusions are formed to have a depth at which a portion of a contact surface between the first and second support substrates is removable.

13. The method of claim 1, wherein the protrusions are a plurality of protrusions.

14. The method of claim 13, wherein the step of forming the light emitting structure includes the step of:
    dividing the light emitting structure into a plurality of light emitting structures.

15. The method of claim 14, further comprising the step of:
    attaching the plurality of protrusions to corresponding ones of the plurality of light emitting structures.

16. The method of claim 15, wherein the portion of the support substrate is separated from the light emitting structure during the step of attaching the one or more protrusions of the support substrate to the one surface of the light emitting structure or thereafter.

17. The method of claim 16, wherein:
    only at least portions of the protrusions are combined with the light emitting structure to remain by the separating of the portion of the support substrate from the light emitting structure, and
    the plurality of protrusions are separated from one another by the plurality of light emitting structure devices.

18. The method of claim 1, wherein the light emitting structure is formed on the growth substrate, such that the light emitting structure further includes a reflective layer formed on the second conductive semiconductor layer.

* * * * *